(12) United States Patent
Lee

(10) Patent No.: US 10,923,198 B2
(45) Date of Patent: Feb. 16, 2021

(54) MEMORY DEVICE AND MEMORY SYSTEM INCLUDING THE SAME

(71) Applicant: SK hynix Inc., Gyeonggi-do (KR)

(72) Inventor: Sok Kyu Lee, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/238,126

(22) Filed: Jan. 2, 2019

(65) Prior Publication Data
US 2019/0355428 A1    Nov. 21, 2019

(30) Foreign Application Priority Data

May 15, 2018  (KR) .................. 10-2018-0055548

(51) Int. Cl.
| G11C 16/10 | (2006.01) |
| G11C 16/30 | (2006.01) |
| G11C 7/10  | (2006.01) |
| G11C 5/14  | (2006.01) |
| G11C 16/14 | (2006.01) |
| G11C 16/26 | (2006.01) |
| G11C 16/08 | (2006.01) |

(52) U.S. Cl.
CPC ............... *G11C 16/30* (2013.01); *G11C 5/14* (2013.01); *G11C 7/109* (2013.01); *G11C 7/1063* (2013.01); *G11C 16/08* (2013.01); *G11C 16/14* (2013.01); *G11C 16/26* (2013.01)

(58) Field of Classification Search
CPC ...................................... G11C 16/10
USPC .................................... 365/185.22
See application file for complete search history.

(56) References Cited

U.S. PATENT DOCUMENTS

2015/0063036 A1*   3/2015   Kamigaichi ........... G11C 16/10
                                                    365/185.22

FOREIGN PATENT DOCUMENTS

| KR | 100645047    | 11/2006 |
| KR | 1020140078980 | 6/2014  |

* cited by examiner

*Primary Examiner* — Jason Lappas
(74) *Attorney, Agent, or Firm* — IP & T Group LLP

(57) ABSTRACT

Provided herein may be a memory device and a memory system including the same. The memory device may include a logic group configured to generate and output driver control signals based on data received from an external device; and an internal power supply circuit configured to control current corresponding to an internal power supply voltage in response to the driver control signals, wherein the internal power supply circuit increases the current corresponding to the internal power supply voltage as the number of first data in the received data increases.

4 Claims, 5 Drawing Sheets

MEMORY DEVICE AND MEMORY SYSTEM INCLUDING THE SAME

CROSS-REFERENCE TO RELATED APPLICATION

The present application claims priority under 35 U.S.C. § 119(a) to Korean patent application number 10-2018-0055548, filed on May 15, 2018, the entire disclosure of which is incorporated herein by reference in its entirety.

BACKGROUND

1. Technical Field

Various embodiments of the present disclosure generally relate to a memory device and a memory system including the memory device. Particularly, the embodiments relate to a memory device capable of efficiently controlling internal power, and a memory system including the memory device.

2. Related Art

A memory system includes a memory device configured to program data, or read or erase the programmed data in response to a command received from a host, and a memory controller configured to control the memory device.

The memory device may include internal components/circuits, and an internal power supply circuit for supplying internal power. The internal power supply circuit receives external power, reduces the level of the external power, and supplies it to the memory device as internal power.

Since various circuits in the memory device operate use internal power supplied from the internal power supply circuit, reliable supply of the internal power is required to secure the reliability of the memory device.

SUMMARY

Various embodiments of the present disclosure are directed to a memory device to which internal power may be reliably supplied, and a memory system including the memory device.

An embodiment of the present disclosure may provide for a memory device including: a logic group configured to generate and output driver control signals based on data received from an external device; and an internal power supply circuit configured to control current corresponding to an internal power supply voltage in response to the driver control signals, wherein the internal power supply circuit increases the current corresponding to the internal power supply voltage as the number of first data in the received data increases.

An embodiment of the present disclosure may provide for a memory device including: a memory cell array including memory cells each of which is programmed into a programmed cell corresponding to first data or an erased cell corresponding to second data; a peripheral circuit configured to operate using an internal power supply voltage and program the memory cells; a logic group configured to generate and output driver control signals based on data received from an external device during a program operation, the received data including the first data and the second data; and an internal power supply circuit configured to control current corresponding to the internal power supply voltage in response to the driver control signals.

An embodiment of the present disclosure may provide for a memory system including: a memory controller configured to output a command, an address, and data to be programmed, in response to a request from a host; and a memory device configured to operate using an internal power supply voltage, and perform a program operation in response to the command, the address, and the plurality of data, wherein the memory device controls current corresponding to the internal power supply voltage based on the data.

An embodiment of the present disclosure may provide for a memory system including: a memory controller configured to output a command, an address, data to be programmed, and a count signal corresponding to the data, in response to a request from a host; and a memory device configured to operate using an internal power supply voltage, and perform a program operation in response to the command, the address, and the data, wherein the memory device controls current corresponding to the internal power supply voltage based on the count signal.

An embodiment of the present disclosure may provide for a memory device including: a memory cell array including a plurality of memory cells; an internal power supply circuit configured to receive an external power supply voltage, convert the external power supply voltage into an internal power supply voltage, and supply the internal power supply voltage to the memory cell array; and a logic group configured to control the internal power supply circuit based on the number of program data in data received from a memory controller such that an amount of current corresponding to the internal power supply voltage supplied to the memory cell array is adjusted based on the number of program data in the received data.

DETAILED DESCRIPTION

Figure 1:
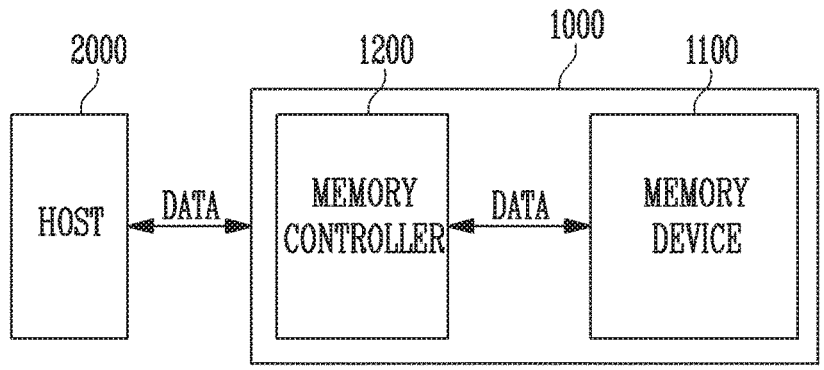
FIG. 1 is a diagram illustrating a memory system including a memory device in accordance with an embodiment of the present disclosure.

Various embodiments will now be described more fully hereinafter with reference to the accompanying drawings;

however, elements and features of the present invention may be configured or arranged differently than described and illustrated herein. Thus, the present invention is not limited to the embodiments set forth herein. Rather, these embodiments are provided so that this disclosure is thorough and complete and fully conveys the scope of the present disclosure to those skilled in the art. Also, throughout the specification, reference to "an embodiment" or the like is not necessarily to only one embodiment, and different references to any such phrase are not necessarily to the same embodiment(s).

In the drawings, dimensions of the figures may be exaggerated for clarity of illustration. It will be understood that when an element is referred to as being "between" two elements, it can be the only element between the two elements, or one or more intervening elements may also be present.

Embodiments are described herein with reference to schematic and sectional illustrations of structures, intermediate structures, and components (elements). The drawings are not intended to depict the actual shape of any such element, which may vary according to design as well as manufacturing techniques and/or tolerances. Thus, embodiments should not be construed as limited to the particular shapes of elements illustrated herein. In the drawings, lengths and sizes of layers and regions may be exaggerated for clarity. Like reference numerals in the drawings denote like elements.

Terms such as "first" and "second" may be used to identify various components, but any such term does not limit the scope of the so identified component. Those terms are only used for the purpose of differentiating a component from other components that have the same or similar names. For example, a first component in one instance may be referred to as a second component in another instance, and vice versa without departing from the spirit and scope of the present disclosure. Furthermore, "and/or" may include any one of or a combination of the components mentioned.

Furthermore, a singular form may include a plural and vice versa, unless the context indicates otherwise. Furthermore, "include/comprise" or "including/comprising," as used in the specification represents that one or more stated components, steps, operations, and elements exist or are added but does not preclude the presence or addition of one or more other components, steps, operations, or elements.

Furthermore, unless defined otherwise, all the terms used in this specification including technical and scientific terms have the same meanings as would be generally understood by those skilled in the related art. The terms defined in generally used dictionaries should be construed as having the same meanings as would be construed in the context of the related art, and unless clearly defined otherwise in this specification, should not be construed as having idealistic or overly formal meanings.

It is also noted that in this specification, "connected/coupled" refers to one component not only directly coupling another component but also indirectly coupling another component through one or more intermediate components. On the other hand, "directly connected/directly coupled" refers to one component directly coupling another component without an intermediate component. Whether the connection/coupling between two components is direct or indirect, any communication between such components may be wired or wireless, unless the context indicates otherwise.

FIG. 1 is a diagram illustrating a memory system 1000 in accordance with an embodiment of the present disclosure.

Referring to FIG. 1, the memory system 1000 may include a memory device 1100 configured to store data, and a memory controller 1200 configured to control the memory device 1100 under control of a host 2000.

The host 2000 may communicate with the memory system 1000 using an interface protocol such as a peripheral component interconnect express (PCI-e or PCIe) protocol, an advanced technology attachment (ATA) protocol, a serial ATA (SATA) protocol, a parallel ATA (PATA) protocol, or a serial attached SCSI (SAS) protocol. Other interface protocols such as a universal serial bus (USB) protocol, a multimedia card (MMC) protocol, an enhanced small disk interface (ESDI) protocol, or an integrated drive electronics (IDE) protocol may also be used.

The memory controller 1200 may control the overall operation of the memory system 1000 and data exchange between the host 2000 and the memory device 1100. For instance, the memory controller 1200 may control the memory device 1100 to program or read data in response to a request of the host 2000. In an embodiment, the memory device 1100 may include a double data rate synchronous dynamic random access memory (DDR SDRAM), a low power double data rate4 (LPDDR4) SDRAM, a graphics double data rate (GDDR) SDRAM, a low power DDR (LPDDR), a rambus dynamic random access memory (RDRAM), or a flash memory.

The memory device 1100 may perform a program operation, a read operation, or an erase operation under control of the memory controller 1200.

Figure 2:
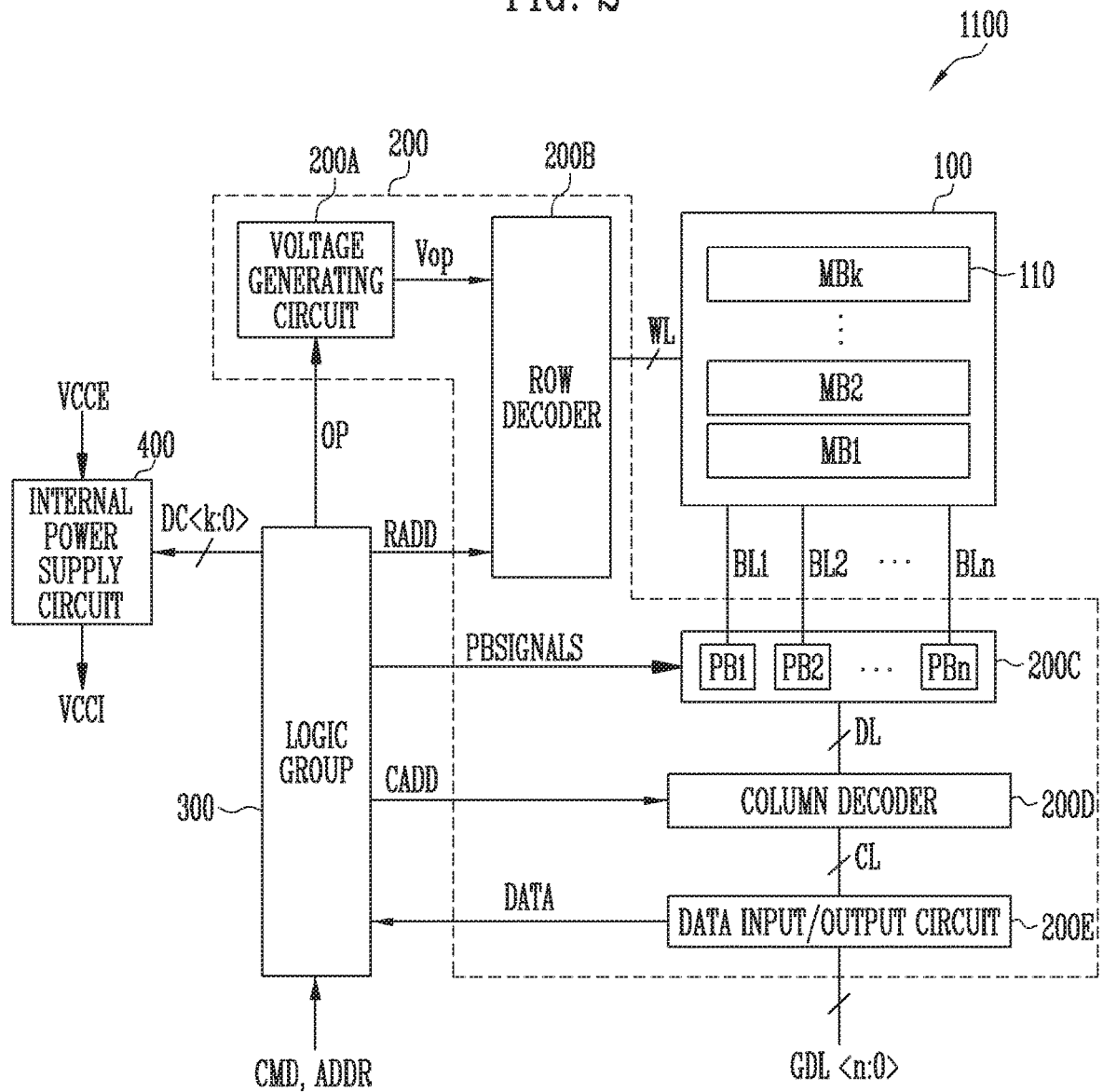
FIG. 2 is a diagram illustrating a memory device in accordance with an embodiment of the present disclosure.

FIG. 2 is a diagram illustrating a memory device in accordance with an embodiment of the present disclosure, for example, the memory device 1100 of FIG. 1.

Referring to FIG. 2, the memory device 1100 may include a memory cell array 100 configured to store data. The memory device 1100 may include a peripheral circuit 200 configured to perform a program operation for storing data in the memory cell array 100, a read operation for outputting the stored data, and an erase operation for erasing the stored data. The memory device 1100 may include a logic group, e.g., logic circuits, 300 configured to control the peripheral circuit 200 under control of a memory controller (e.g., the memory controller 1200 of FIG. 1). The memory device 1100 may include an internal power supply circuit 400, which may convert external power VCCE supplied from an external device into internal power VCCI and supply the internal power VCCI to the memory device 1100.

The memory cell array 100 may include a plurality of memory blocks MB1 to MBk 110 (where k is a positive integer). Word lines WL and bit lines BL1 to BLn (where n is a positive integer) may be coupled to each of the memory blocks MB1 to MBk 110. For example, the word lines WL may further include a first select line, a second select line, and dummy lines. The first select line may be a source select line. The second select line may be a drain select line. For example, the word lines WL may further include pipelines. The word lines WL may be coupled to each of the memory blocks MB1 to MBk 110. The bit lines BL1 to BLn may be coupled in common to the memory blocks MB1 to MBk 110. The memory blocks MB1 to MBk 110 may be embodied in a two- or three-dimensional structure. For example, in the memory blocks 110 having a two-dimensional structure, the memory cells may be arranged in a direction parallel to a substrate. For example, in the memory blocks 110 having a three-dimensional structure, the memory cells may be stacked in a direction perpendicular to the substrate.

The peripheral circuit 200 may perform a program operation, a read operation, or an erase operation on a selected memory block of the memory blocks 110 under control of the logic group 300. For example, during a program operation, the peripheral circuit 200 may supply a program voltage and a pass voltage to the word lines WL under control of the logic group 300, and may control potential levels of the bit lines BL1 to BLn depending on data to be programmed.

In an embodiment, the peripheral circuit 200 may include a voltage generating circuit 200A, a row decoder 200B, a page buffer group 200C, a column decoder 200D, and a data input/output circuit 200E.

The voltage generating circuit 200A may generate various operating voltages Vop to be used for the program operation, the read operation, and the erase operation in response to an operating signal OP. Furthermore, the voltage generating circuit 200A may selectively discharge the word lines WL in response to an operating signal OP. For example, the voltage generating circuit 200A may generate a program voltage, a verify voltage, a pass voltage, a read voltage, and a source line voltage under control of the logic group 300.

The row decoder 200B may transmit operating voltages Vop to word lines WL coupled to a selected memory block of the memory blocks 110 in response to a row address RADD.

The page buffer group 200C may include a plurality of page buffers PB1 to PBn coupled to the bit lines BL1 to BLn. The page buffers PB1 to PBn may operate in response to page buffer control signals PBSIGNALS. In an embodiment, during a program operation, the page buffers PB1 to PBn may temporarily store data which are received through data lines DL and are to be programmed, and may adjust the potential levels of the corresponding bit lines BL1 to BLn. During a read operation, the page buffers PB1 to PBn may temporarily store data received through the bit lines BL1 to BLn, and then output the data to the column decoder 200D through the data lines DL.

The column decoder 200D may transmit data between the data input/output circuit 200E and the page buffer group 200C in response to a column address CADD. For example, the column decoder 200 may exchange data with the page buffers PB1 to PBn through the data lines DL, or exchange data with the data input/output circuit 200E through column lines CL.

The data input/output circuit 200E may exchange data with the column decoder 200D through the column lines CL, and exchange data with an external device (e.g., the memory controller 1200 of FIG. 1) through global data lines GDL<n:0>. Furthermore, the data input/output circuit 200E may temporarily store data received through the column lines CL or the global data lines GDL<n:0>. In addition, during a program operation, the data input/output circuit 200E may output data received through the global data lines GDL<n:0>, to the logic group 300.

The logic group 300 may output an operating signal OP, a row address RADD, page buffer control signals PGSIGNALS, and a column address CADD in response to a command CMD and an address ADDR received from an external device (e.g., the memory controller 1200 of FIG. 1).

Particularly, during a program operation, the logic group 300 may generate and output driver control signals DC<k:0> based on a total number of first data (e.g., data '0') of data DATA, e.g., data 0 data 1, received through the data input/output circuit 200E. It is preferable that the first data be data with which memory cells in the memory cell array 100 are programmed such that the memory cells are converted from erased cells into programmed cells during a program operation.

The internal power supply circuit 400 may convert an external power supply voltage VCCE supplied from the external device into an internal power supply voltage VCCI and output it as internal power VCCI. In response to driver control signals DC<k:0> outputted from the logic group 300, the driving performance of the internal power supply circuit 400 may be controlled. In other words, the internal power supply circuit 400 may adjust current corresponding to the internal power supply voltage VCCI in response to the driver control signals DC<k:0> before outputting the internal power supply voltage VCCI.

The internal power supply voltage VCCI outputted from the internal power supply circuit 400 is supplied into the memory device 1100. In detail, the peripheral circuit 200 and the logic group 300 may operate using the internal power VCCI supplied thereto.

Figure 3:
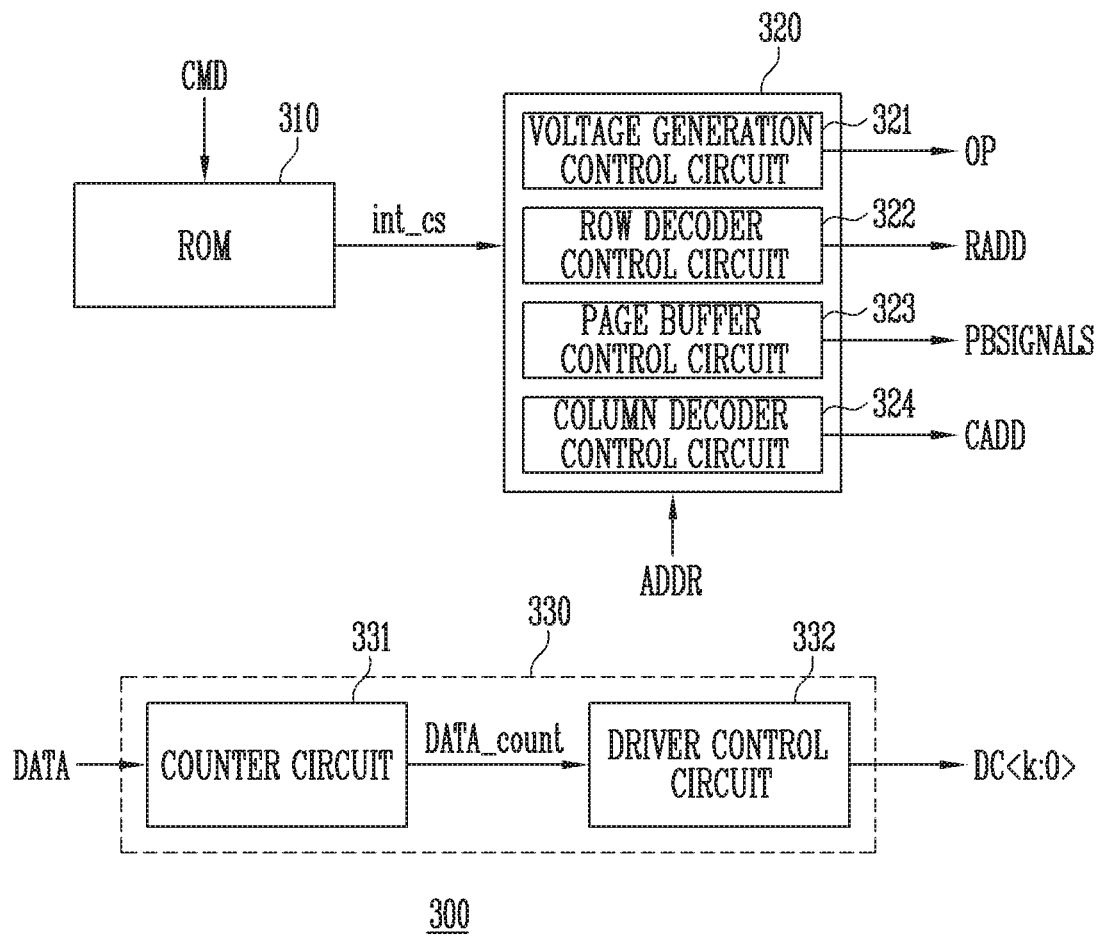
FIG. 3 is a diagram illustrating a logic group in accordance with an embodiment of the present disclosure.

FIG. 3 is a diagram illustrating a logic group in accordance with an embodiment of the present disclosure, for example, the logic group 300 of FIG. 2.

Referring to FIG. 3, the logic group 300 may include a read only memory (ROM 310), a peripheral-circuit control circuit 320, and an internal power control circuit 330.

The ROM 310 may store algorithm for performing the overall operation of the memory device 1100 of FIGS. 1 and 2, and may generate and output an internal control signal int_cs according to a command CMD received from an external device (e.g., the memory controller 1200 of FIG. 1) and the algorithm stored in the ROM 310.

The peripheral-circuit control circuit 320 may generate and output an operating signal OP, a row address RADD, page buffer control signals PBSIGNALS, and a column address CADD, in response to the internal control signal int_cs and an address ADDR.

The peripheral-circuit control circuit 320 may include a voltage generation control circuit 321, a row decoder control circuit 322, a page buffer control circuit 323, and a column decoder control circuit 324. The voltage generation control circuit 321 may generate and output the operating signal OP for controlling the voltage generating circuit 200A of FIG. 2 in response to the internal control signal int_cs. The row decoder control circuit 322 may generate and output the row address RADD for controlling the row decoder 200B of FIG. 2 in response to the internal control signal int_cs and the address ADDR. The page buffer control circuit 323 may generate and output the page buffer control signals PBSIGNALS for controlling the page buffers PB1 to PBn of FIG. 2 in response to the internal control signal int_cs. The column decoder control circuit 324 may generate and output the column address CADD for controlling the column decoder 200D of FIG. 2 in response to the internal control signal int_cs and the address ADDR.

During a program operation, the internal power control circuit 330 may generate and output driver control signals DC<k:0> based on data DATA received from the data input/output circuit 200E of FIG. 2. The data DATA may include at least one first data of a first logic level (e.g., data '0'), or at least one second data of a second logic level (e.g., data '1'). It is preferable that the first data be data with which memory cells in the memory cell array 100 of FIG. 2 are programmed such that the memory cells are converted from erased cells into programmed cells during a program operation. It is preferable that the second data be data with which memory cells in the memory cell array 100 remain in an erased cell state during the program operation. The internal power control circuit 330 may generate and output driver control signals DC<k:0> based on the number of first data in the data DATA.

The internal power control circuit 330 may include a counter circuit 331 and a driver control circuit 332.

The counter circuit 331 may receive the data DATA, count the number of first data in the received data DATA, and output a count signal DATA_count indicative of the count number.

The driver control circuit 332 may receive the count signal DATA_count, and output the driver control signals DC<k:0> in response to the count signal DATA_count. The driver control circuit 332 may control and output logic levels of the driver control signals DC<k:0> corresponding to the number of first data based on the count signal DATA_count. For example, in the case where the number of first data ranges from 0 to n (where n is a natural number), only the driver control signal DC<0> of the driver control signals DC<k:0> is outputted at a certain logic level (e.g., a low level). In the case where the number of first data ranges from (n+1) to 2n, only the driver control signals DC<0> and DC<1> of the driver control signals DC<k:0> are outputted at the low level. In the case where the number of first data ranges from (2n+1) to 3n, only the driver control signals DC<0>, DC<1>, and DC<2> of the driver control signals DC<k:0> are outputted at the low level. In other words, as the number of first data increases, the driver control circuit 332 may increase the number of outputted driver control signals enabled to the low level.

Figure 4:
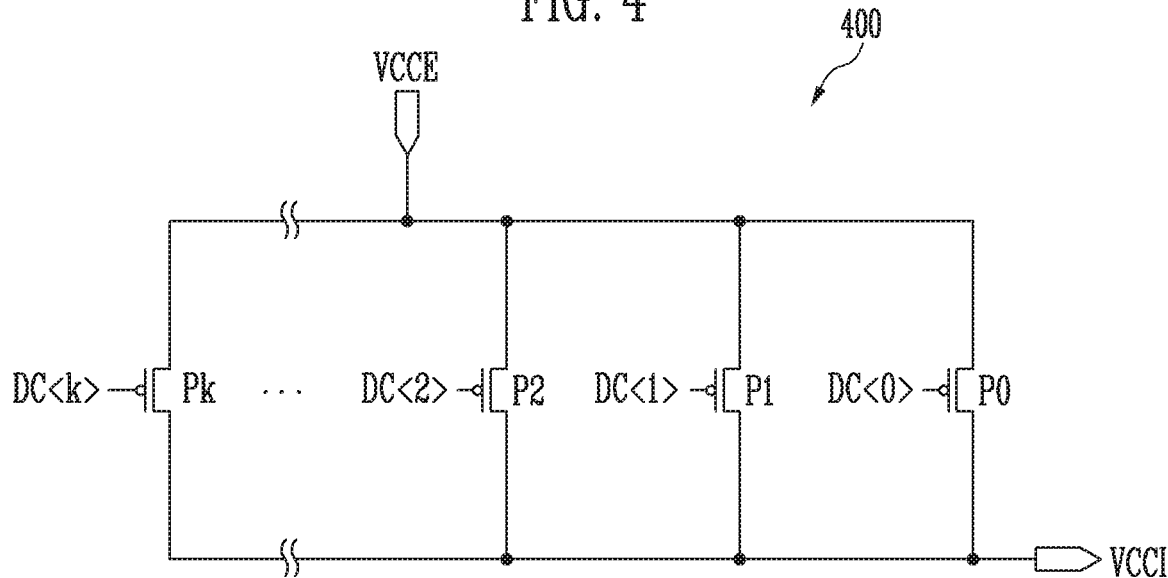
FIG. 4 is a diagram illustrating an internal power supply circuit in accordance with an embodiment of the present disclosure.

FIG. 4 is a diagram illustrating an internal power supply circuit in accordance with an embodiment of the present disclosure, for example, the internal power supply circuit 400 of FIG. 2.

Referring to FIG. 4, the internal power supply circuit 400 may include a plurality of drivers P0 to Pk coupled in parallel with each other between a terminal to which the external power supply voltage VCCE is applied and a terminal from which internal power supply voltage VCCI is outputted. Each of the plurality of drivers P0 to Pk may be embodied by a PMOS transistor, and a gate thereof may be supplied with a corresponding one of the driver control signals DC<k:0>. In detail, the zeroth driver control signal DC<0> is applied to the gate of the zeroth driver P0, the first driver control signal DC<1> is applied to the gate of the first driver P1, and the second driver control signal DC<2> is applied to the gate of the second driver P2. In this way, a k-th driver control signal DC<k> is applied to a gate of a k-th driver Pk.

If the zeroth and the first driver control signals DC<1:0> are enabled to the low level and applied to the internal power supply circuit 400 and the other driver control signals DC<k:2> are enabled to the high level and applied to the internal power supply circuit 400, the zeroth and the first drivers P0 and P1 are enabled, and the other, e.g., second to the k-th drivers P2 to Pk, are disabled. If the external power supply voltage VCCE is applied to an enabled driver, down-converted internal power supply voltage VCCI may be outputted by the enabled driver (i.e., the PMOS transistor of that driver). Here, in the internal power supply circuit 400, depending on the number of enabled drivers of the plurality of drivers P0 to Pk, the driving performance of the internal power supply circuit 400 and the supply current corresponding to the internal power supply voltage VCCI may be adjusted. For instance, as the number of enabled drivers is increased, the driving performance of the internal power supply circuit 400 and the supply current corresponding to the internal power supply voltage VCCI increase. As the number of enabled drivers is reduced, the driving performance of the internal power supply circuit 400 and the supply current corresponding to the internal power supply voltage VCCI is reduced.

Figure 5:
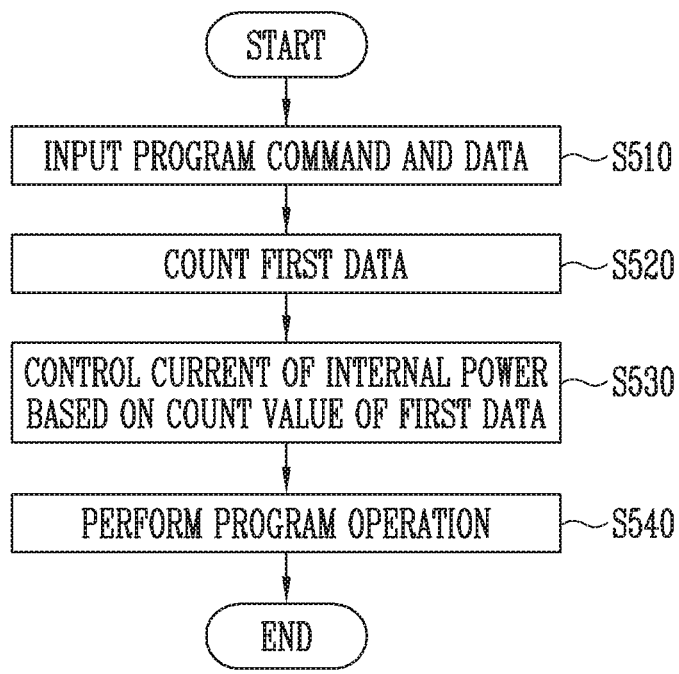
FIG. 5 is a flowchart describing an operation of a memory device in accordance with an embodiment of the present disclosure.

FIG. 5 is a flowchart describing an operation of a memory device in accordance with an embodiment of the present disclosure, for example, the memory device 1100.

A program operation of the memory device 1100 will be described primarily with reference to FIG. 5 and secondarily with reference to FIGS. 1 to 4.

In response to a request from the host 2000, the memory controller 1200 may output a command CMD and an address ADDR corresponding to a program operation, and data DATA to be programmed, to the memory device 1100.

The memory device 1100 may input the received command CMD, address ADDR, and the data DATA to be programmed (at step S510). The logic group 300 may receive the data DATA from the data input/output circuit 200E. The counter circuit 331 of the internal power control circuit 330 may count a total number of first data (for example, '0') in the received data DATA (at step S520) and output a count signal DATA_count. The driver control circuit 332 of the internal power control circuit 330 may output driver control signals DC<k:0> in response to the count signal DATA_count.

The internal power supply circuit 400 may down-convert an external power supply voltage VCCE supplied from the external device into an internal power VCCI and output it as internal power VCCI. Here, in response to the driver control signals DC<k:0> based on the count value of the first data, the driving performance of the internal power supply circuit 400 and the current corresponding to the internal power supply voltage VCCI may be controlled (at step S530).

In the memory device 1100, during the program operation, as the number of first data is increased, the number of memory cells to be programmed from erased cells to programmed cells increases, whereby the current consumption of the program operation is increased. Therefore, by controlling the current corresponding to the internal power supply voltage VCCI to be outputted depending on the number of first data, distortion of the internal power supply voltage VCCI may be mitigated, and the optimum current may be supplied so that unnecessary current consumption may be reduced.

Thereafter, the memory device 1100 may operate using the internal power supply voltage VCCI generated from the internal power supply circuit 400 and perform the program operation (at step S540).

The program operation will be described below.

The logic group 300 may output an operating signal OP, a row address RADD, page buffer control signals PBSIGNALS, and a column address CADD, in response to the command CMD and the address ADDR corresponding to the program operation. The column decoder 200D may transmit, in response to the column address CADD, data received from the data input/output circuit 200E and to be programmed, to the page buffer group 200C. The page buffer group 200C may temporarily store, in response to the page buffer control signals PBSIGNALS, the data to be programmed. Then, the page buffer group 200C may apply a program allowable voltage (e.g., a ground voltage) or a program inhibit voltage (e.g., a power supply voltage) to the bit lines BL1 to BLn depending on the temporarily stored data. For example, in the case where the first data is temporarily stored in the page buffer (e.g., PB1), the page buffer PB1 applies a program allowable voltage to the corresponding bit line BL1. For example, in the case where the second data is temporarily stored in the page buffer (e.g., PB1), the page buffer PB1 applies a program inhibit voltage to the corresponding bit line BL1. The voltage generating circuit 200A may generate and output, in response to the operating signal OP, operating voltages Vop including a program voltage and a pass voltage to be used for the program operation. The row decoder 200B may transmit the operating voltages Vop outputted from the voltage generating circuit 200A, to word lines WL coupled to a selected memory block 110 in response to the row address RADD. For example, the program voltage is applied to a selected word line of the word lines WL, and the pass voltage is applied to unselected word lines.

As a result of performing the program operation, the program state of each memory cell in which the first data is stored is converted from an erased cell into a programmed cell, and each memory cell in which the second data is stored remains in an erased cell state.

Figure 6:
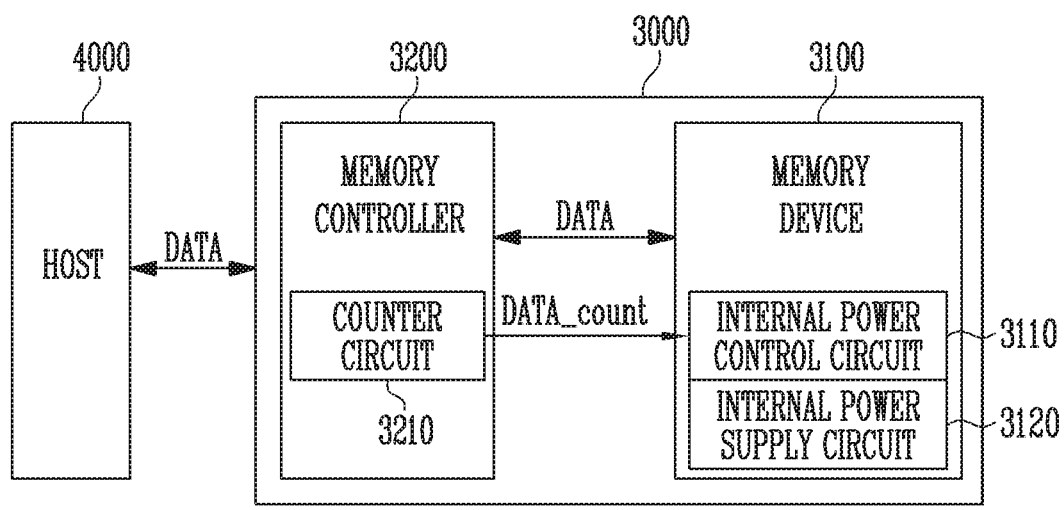
FIG. 6 is a diagram illustrating a memory system in accordance with an embodiment of the present disclosure.

FIG. 6 is a diagram illustrating a memory system 3000 in accordance with an embodiment of the present disclosure.

Referring to FIG. 6, the memory system 3000 may include a memory device 3100 configured to store data, and a memory controller 3200 configured to control the memory device 3100 under control of a host 4000.

As described with reference to FIG. 1, the host 4000 may use an interface protocol to communicate with the memory system 3000.

The memory controller 3200 may control the overall operation of the memory system 3000 and data exchange between the host 4000 and the memory device 3100. For instance, the memory controller 3200 may control the memory device 3100 to program or read data in response to a request of the host 4000.

The memory controller 3200 may include a counter circuit 3210. When a program command and data to be programmed are received from the host 4000, the memory controller 3200 may count the number of first data in the received data using the counter circuit 3210, and output a count signal DATA_count to the memory device 3100. It is preferable that the first data be data with which memory cells included in the memory device 3100 are programmed such that the memory cells are converted from erased cells into programmed cells during a program operation.

The counter circuit 3210 may be configured and operated in the same manner as the counter circuit 331 described with reference to FIG. 3.

The memory device 3100 may perform a program operation, a read operation, or an erase operation under control of the memory controller 3200.

The memory device 3100 may include an internal power control circuit 3110 and an internal power supply circuit 3120. During a program operation, the internal power control circuit 3110 may receive a count signal DATA_count outputted from the counter circuit 3210 of the memory controller 3200, and generate driver control signals based on the count signal DATA_count. The internal power control circuit 3110 may be configured and operated in the same manner as those of the driver control circuit 332 of FIG. 3. The internal power supply circuit 3120 may down-convert an external power supply voltage supplied from the external device into an internal power supply voltage and output it as internal power. The internal power supply voltage may be used as the driving power of the memory device 3100. The internal power supply circuit 3120 may control the driving performance in response to the driver control signals outputted from the internal power control circuit 3110. In other words, the internal power supply circuit 3120 may control the current corresponding to the internal power supply voltage in response to the driver control signals before outputting the internal power supply voltage. The internal power supply circuit 3120 may be configured and operated in the same manner as the internal power supply circuit 400 of FIG. 4.

Figure 7:
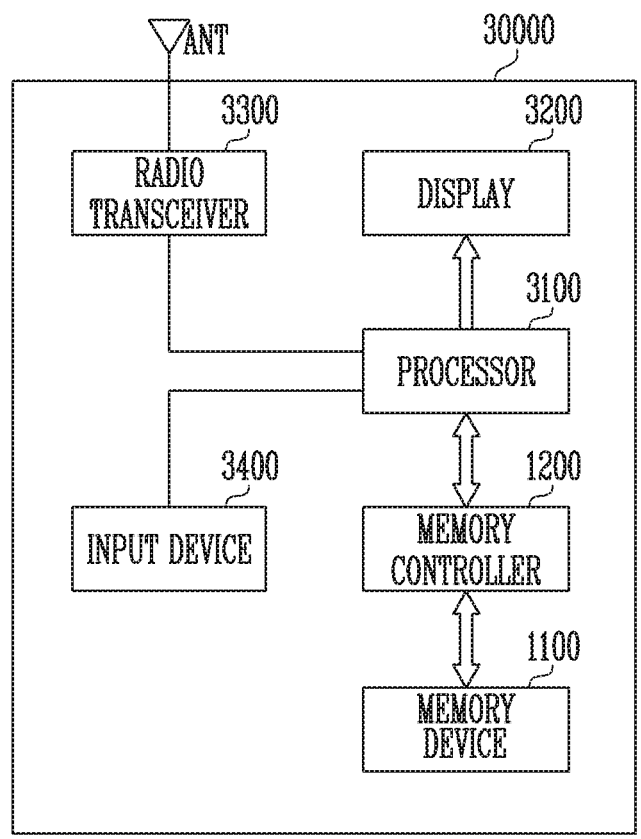
FIG. 7 is a diagram illustrating a memory system including a memory device in accordance with an embodiment of the present disclosure.

FIG. 7 is a diagram illustrating a memory system 30000 including a memory device in accordance with an embodiment of the present disclosure, for example, the memory device shown 1200 in FIG. 2.

Referring to FIG. 7, the memory system 30000 may be embodied in a cellular phone, a smartphone, a tablet personal computer (PC), a personal digital assistant (PDA) or a wireless communication device. The memory system 30000 may include a memory device 1100, and the memory controller 1200 configured to control the operation of the memory device 1100. The memory controller 1200 may control a data access operation, e.g., a program operation, an erase operation, or a read operation, of the memory device 1100 under control of a processor 3100.

Data programmed in the memory device 1100 may be outputted through a display 3200 under control of the memory controller 1200.

A radio transceiver 3300 may send and receive radio signals through an antenna ANT. For example, the radio transceiver 3300 may convert a radio signal received through the antenna ANT into a signal capable of being processed in the processor 3100. Therefore, the processor 3100 may process a signal output from the radio transceiver 3300 and transmit the processed signal to the memory controller 1200 or the display 3200. The memory controller 1200 may program a signal processed by the processor 3100 to the memory device 1100. Furthermore, the radio transceiver 3300 may convert a signal output from the processor 3100 into a radio signal, and output the converted radio signal to an external device through the antenna ANT. An input device 3400 may be used to input a control signal for controlling the operation of the processor 3100 or data to be processed by the processor 3100. The input device 3400 may be embodied in a pointing device such as a touch pad and a computer mouse, a keypad or a keyboard. The processor 3100 may control the operation of the display 3200 such that data outputted from the memory controller 1200, data outputted from the radio transceiver 3300, or data outputted form the input device 3400 is outputted through the display 3200.

In an embodiment, the memory controller 1200 capable of controlling the operation of the memory device 1100 may be embodied as a part of the processor 3100 or a chip provided separately from the processor 3100.

Figure 8:
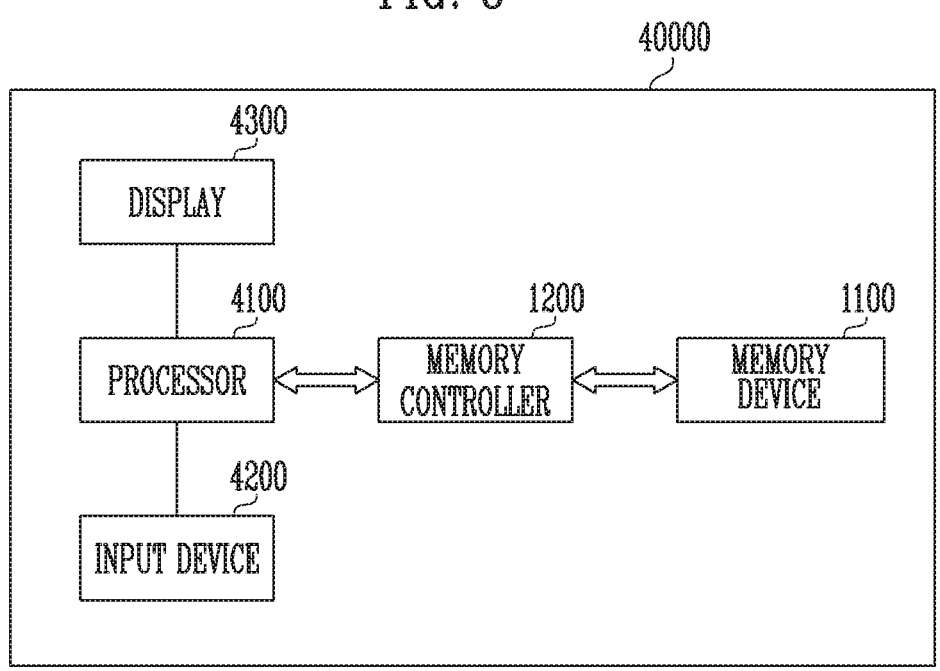
FIG. 8 is a diagram illustrating a memory system including a memory device in accordance with an embodiment of the present disclosure.

FIG. 8 is a diagram illustrating a memory system 40000 including a memory device in accordance with an embodiment of the present disclosure, for example, the memory device 1200 shown in FIG. 2.

Referring to FIG. 8, the memory system 40000 may be embodied in a personal computer (PC), a tablet PC, a net-book, an e-reader, a personal digital assistant (PDA), a portable multimedia player (PMP), an MP3 player, or an MP4 player.

The memory system 40000 may include a memory device 1100, and the memory controller 1200 configured to control a data process operation of the memory device 1100.

A processor 4100 may output data stored in the memory device 1100 through a display 4300, according to data inputted from an input device 4200. For example, the input device 4200 may be embodied in a pointing device such as a touch pad or a computer mouse, a keypad, or a keyboard.

The processor 4100 may control the overall operation of the memory system 40000 and control the operation of the memory controller 1200. In an embodiment, the memory controller 1200 capable of controlling the operation of the memory device 1100 may be embodied as a part of the processor 4100 or a chip provided separately from the processor 4100.

Figure 9:
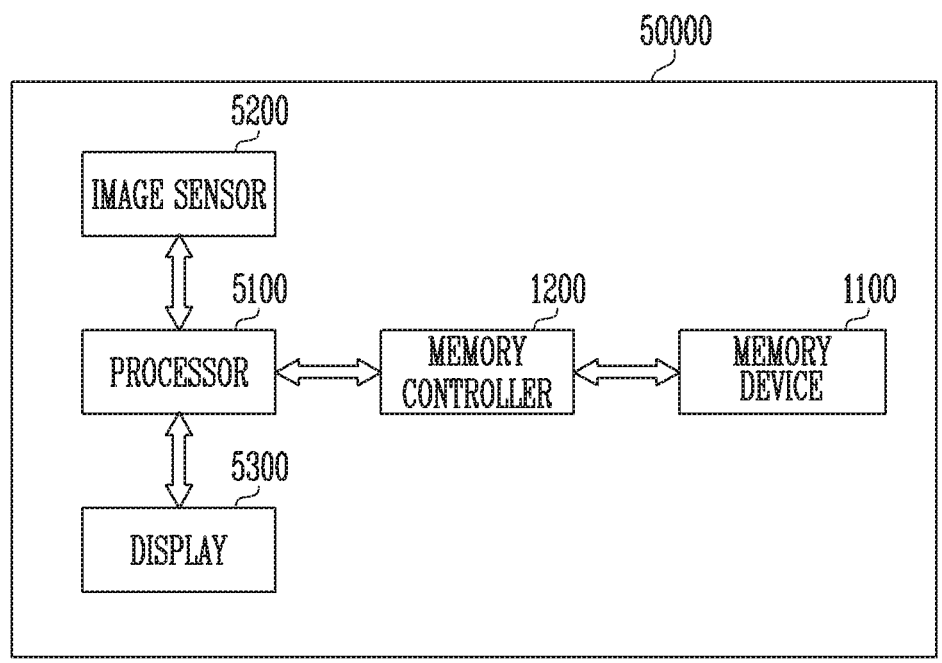
FIG. 9 is a diagram illustrating a memory system including a memory device in accordance with an embodiment of the present disclosure.

FIG. 9 is a diagram illustrating a memory system 50000 including a memory device in accordance with an embodiment of the present disclosure, for example, the memory device 1200 shown in FIG. 2.

Referring to FIG. 9, the memory system 50000 may be embodied in an image processing device, e.g., a digital camera, a portable phone provided with a digital camera, a smartphone provided with a digital camera, or a tablet personal computer (PC) provided with a digital camera.

The memory system 50000 may include a memory device 1100, and the memory controller 1200 capable of controlling a data processing operation, e.g., a program operation, an erase operation, or a read operation, of the memory device 1100.

An image sensor 5200 of the memory system 50000 may convert an optical image into digital signals. The converted digital signals may be transmitted to a processor 5100 or the memory controller 1200. Under control of the processor 5100, the converted digital signals may be outputted through a display 5300 or stored in the memory device 1100 through the memory controller 1200. Data stored in the memory device 1100 may be outputted through the display 5300 under control of the processor 5100 or the memory controller 1200.

In an embodiment, the memory controller 1200 capable of controlling the operation of the memory device 1100 may be embodied as a part of the processor 5100 or a chip provided separately from the processor 5100.

Figure 10:
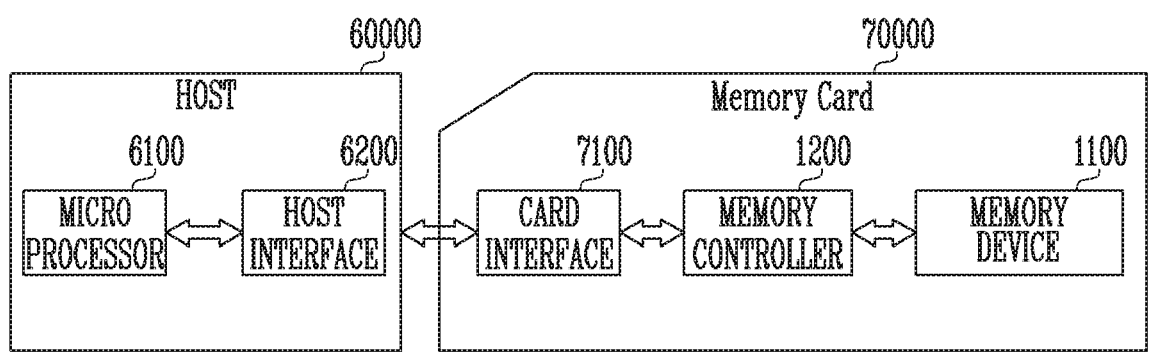
FIG. 10 is a diagram illustrating a memory system including a memory device in accordance with an embodiment of the present disclosure.

FIG. 10 is a diagram illustrating a memory system 70000 including a memory device in accordance with an embodiment of the present disclosure, for example, the memory device 1200 shown in FIG. 2.

Referring to FIG. 10, the memory system 70000 may be embodied in a memory card or a smart card. The memory system 70000 may include a memory device 1100, the memory controller 1200, and a card interface 7100.

The controller 1200 may control data exchange between the memory device 1100 and the card interface 7100. In an embodiment, the card interface 7100 may be a secure digital (SD) card interface or a multi-media card (MMC) interface, but the card interface 7100 is not limited thereto.

The card interface 7100 may interface data exchange between a host 60000 and the memory controller 1200 according to a protocol of the host 60000. In an embodiment, the card interface 7100 may support a universal serial bus (USB) protocol, and an interchip (IC)-USB protocol. Here, the card interface 7100 may be hardware capable of supporting a protocol which is used by the host 60000, software installed in the hardware, or a signal transmission scheme.

When the memory system 70000 is connected to a host interface 6200 of the host 60000 such as a personal computer (PC), a tablet PC, a digital camera, a digital audio player, a cellular phone, console video game hardware or a digital set-top box, the host interface 6200 may perform data communication with the memory device 1100 through the card interface 7100 and the memory controller 1200 under control of a microprocessor 6100.

As described above, in a memory device in accordance with embodiments of the present disclosure, during a program operation, current corresponding to an internal power supply voltage may be controlled based on specific data with which memory cells are programmed to be converted from erased cells to programmed cells among a plurality of data. Therefore, the internal power supply voltage may be efficiently supplied.

Various embodiments have been disclosed herein, and although specific terms are employed, they are used and are to be interpreted in a generic and descriptive sense and not for purpose of limitation. In some instances, as would be apparent to one skilled in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A memory device comprising:
 a memory cell array including memory cells;
 a voltage generating circuit configured to generate operating voltages during a program operation;
 a row decoder configured to transmit the operating voltages to the memory cells array during the program operation;
 a page buffer group configured to receive, during the program operation, a plurality of data and control bit lines of the memory cell array;
 a logic group configured to generate and output driver control signals based on data received from an external device; and
 an internal power supply circuit configured to control current corresponding to an internal power supply voltage in response to the driver control signals,
 wherein the internal power supply circuit increases the current corresponding to the internal power supply voltage as the number of first data in the received data increases, and
 wherein the voltage generating circuit, the row decoder, the page buffer group and the logic group operate using the internal power supply voltage.

2. The memory device according to claim 1, wherein the first data corresponds to a programmed cell during the program operation, and second data among the received data corresponds to an erased cell during the program operation.

3. The memory device according to claim 1, wherein the logic group comprises:
 a counter circuit configured to count the number of first data included in the received data and output a count signal; and
 a driver control circuit configured to generate and output the driver control signals in response to the count signal.

4. The memory device according to claim 3, wherein the internal power supply circuit comprises a plurality of drivers, and each of the plurality of drivers is enabled in response to a corresponding one of the driver control signals.

* * * * *